United States Patent
Coquand et al.

(10) Patent No.: US 10,553,723 B2
(45) Date of Patent: Feb. 4, 2020

(54) METHOD FOR FORMING DOPED EXTENSION REGIONS IN A STRUCTURE HAVING SUPERIMPOSED NANOWIRES

(71) Applicants: COMMISSARIAT A L'ENERGIE ATOMIQUE ET AUX ENERGIES ALTERNATIVES, Paris (FR); INTERNATIONAL BUSINESS MACHINES CORPORATION, Yorktown Heights, NY (US)

(72) Inventors: Remi Coquand, Les Marches (FR); Nicolas Loubet, Guilderland, NY (US); Shay Reboh, Grenoble (FR); Robin Chao, Cohoes, NY (US)

(73) Assignees: COMMISSARIAT A L'ENERGIE ATOMIQUE ET AUX ENERGIES ALTERNATIVES, Paris (FR); INTERNATIONAL BUSINESS MACHINES CORPORATION, Yorktown Heights, NY (US)

( * ) Notice: Subject to any disclaimer, the term of this patent is extended or adjusted under 35 U.S.C. 154(b) by 0 days.

(21) Appl. No.: 16/054,524

(22) Filed: Aug. 3, 2018

(65) Prior Publication Data

US 2019/0051744 A1    Feb. 14, 2019

(30) Foreign Application Priority Data

Aug. 11, 2017 (FR) ...................................... 17 57673

(51) Int. Cl.
*H01L 29/78* (2006.01)
*H01L 29/161* (2006.01)
(Continued)

(52) U.S. Cl.
CPC ........ *H01L 29/785* (2013.01); *H01L 21/2255* (2013.01); *H01L 21/324* (2013.01);
(Continued)

(58) Field of Classification Search
None
See application file for complete search history.

(56) References Cited

U.S. PATENT DOCUMENTS 8,796,124 B2    8/2014  Jeng
9,450,097 B2 *  9/2016  Tsai .................... H01L 21/2254
(Continued)

OTHER PUBLICATIONS

French Preliminary Search Report dated Apr. 17, 2018 in French Application 17 57673, filed Aug. 11, 2017 (with English Translation of Categories of cited documents).
(Continued)

*Primary Examiner* — Asok K Sarkar
(74) *Attorney, Agent, or Firm* — Oblon, McClelland, Maier & Neustadt, L.L.P.

(57) ABSTRACT

A method is provided of fabricating a microelectronic device including a semiconductor structure provided with semiconductor bars positioned above one another, the method including the following steps: creating, on a substrate, a stacked structure including an alternation of first bars containing a first material and having a first critical dimension and second bars containing a second material, the second material being a semiconductor, the second bars having a second critical dimension greater than the first critical dimension, then, surface doping protruding lateral portions of the second bars before forming a source and drain block on the portions.

8 Claims, 2 Drawing Sheets

(51) Int. Cl.
    *H01L 21/225*     (2006.01)
    *H01L 21/324*     (2006.01)
    *H01L 21/8238*     (2006.01)
    *H01L 29/167*     (2006.01)
    *H01L 29/66*     (2006.01)

(52) U.S. Cl.
    CPC .... *H01L 21/823821* (2013.01); *H01L 29/161* (2013.01); *H01L 29/167* (2013.01); *H01L 29/66803* (2013.01); *H01L 29/7834* (2013.01); *H01L 29/7842* (2013.01)

(56) References Cited

U.S. PATENT DOCUMENTS

| | | | |
|---|---|---|---|
| 2014/0014904 A1 | 1/2014 | Cohen et al. | |
| 2015/0340457 A1 | 11/2015 | Xie et al. | |
| 2015/0372115 A1* | 12/2015 | Koh | H01L 29/6656 438/301 |
| 2017/0069763 A1 | 3/2017 | Doris et al. | |
| 2017/0194430 A1 | 7/2017 | Wood et al. | |
| 2019/0172926 A1* | 6/2019 | Ching | H01L 29/66545 |
| 2019/0179227 A1* | 6/2019 | Park | G03F 7/0046 |

OTHER PUBLICATIONS

Lauer, I., et al. "Si Nanowire CMOS Fabricated with Minimal Deviation from RMG FinFET Technology Showing Record Performance", Symposium or VLSI Technology Digest of Technical Papers, 2015, 2 pages.

Barraud, S., et al. "Opportunities and Challenges of Nanowire-Based CMOS Technologies". SOI-3D-Subthreshold Microelectronics Technology Unified Conference (S3S), 2015, 3 pages.

Ho, J., et al. "Wafer-Scale, Sub-5 nm Junction Formation by Monolayer Doping and Conventional Spike Annealing", Nanoletters, vol. 9, No. 2, 2009, 6 pages.

Seidel. T.. et al. "Ald Process for Dopant-Rich Films on Si", 21st International Conference on Ion implantation Technology . (IIT, 2016, 4 pages.

Felch, S., et al. "Plasma Doping of Silicon Fin Structures", 11th International Workshop on Junction Technology (IWJT), 2011, 4 pages.

Barraud, S., et al. "Vertically Stacked-Nano Wires MOSFETs in a Replacement Metal Gate Process with Inner Spacer and SiGe Source/Drain", IEEE International Electron Devices Meeting (IEDM), 2016, 4 pages.

Sasaki, Y., et at "Novel Junction Design for NMOS Si Bulk-FinFETs with Extension Doping by PEALD Phosphorus Doped Silicate Glass", IEEE International Electron Devices Meeting (IEDM), 2015, 4 pages.

Sasaki, Y., et al "Improved Sidewall Doping of Extensions by AsH, Ion Assisted Deposition and Doping (IADD) with Small Implant Angle for Scaled NMOS Si Bulk FinFETs", IEEE International Electron Devices Meeting (IEDM), 2013, 4 pages.

Ang, K., et al.. "300mm FinFET Results Utilizing Conformal, Damage Free, Ultra Shallow Junctions ($X_j$~5nm) Formed with Molecular Monolayer Doping Technique", IEEE International Electron Devices Meeting (IEDM), 2011, 4 pages.

\* cited by examiner

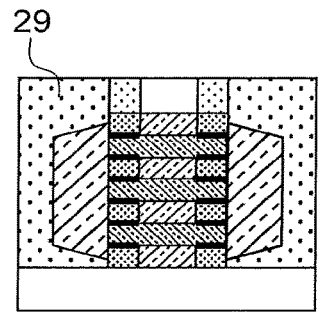 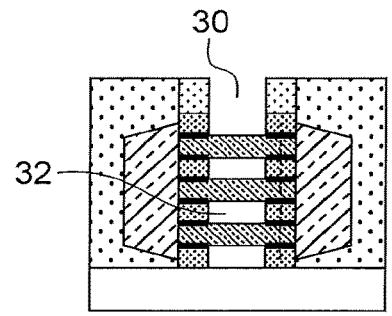 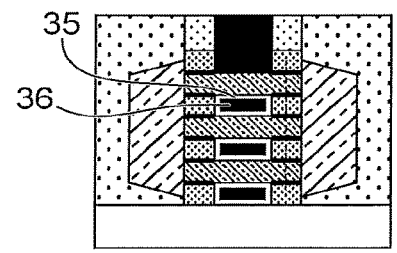
FIG.1I  FIG.1J  FIG.1K
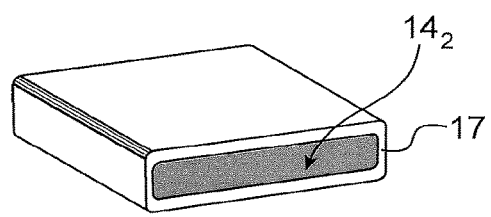 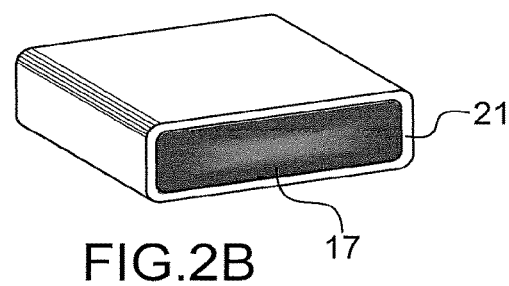
FIG.2A  FIG.2B
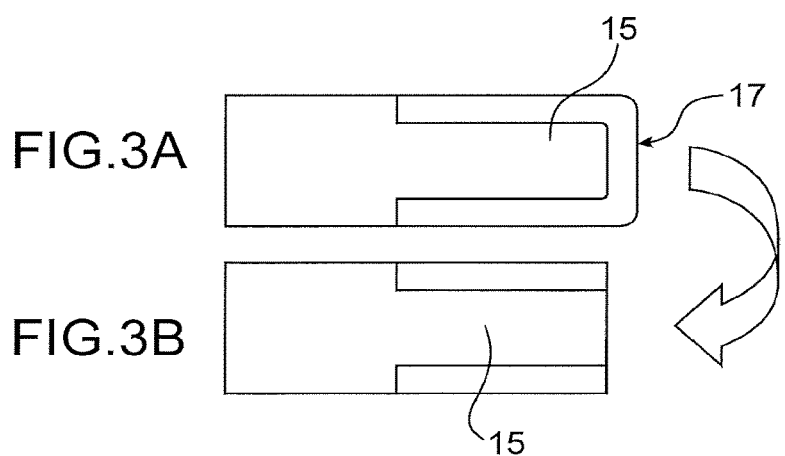
FIG.3A
FIG.3B

METHOD FOR FORMING DOPED EXTENSION REGIONS IN A STRUCTURE HAVING SUPERIMPOSED NANOWIRES

TECHNICAL FIELD AND PRIOR ART

The present invention relates to the field of microelectronics and more particularly to that of transistors, and relates to the fabrication of at least one transistor provided with a semiconductor channel structure in the form of a plurality of semiconductor bars also called "nanowires" positioned one on top of the other.

The document "Si Nanowire CMOS Fabricated with Minimal Deviation from RMG FinFET Technology Showing Record Performance", by Lauer et al., 2015 Symposium on VLSI Technology Digest of Technical Papers presents, for example, a method for manufacturing a transistor having a channel structure in the form of nanowires positioned one on top of the other. A coating gate surrounds portions of nanowires of this structure.

The document "Opportunities and Challenges of Nanowire-Based CMOS Technologies", by Barraud et al., SOI-3D-Subthreshold Microelectronics Technology Unified Conference (S3S), 2015 IEEE presents another example of a method for manufacturing gate-all-around transistors having a semiconductor channel structure in the form of nanowires positioned one on top of the other.

These examples of methods involve the formation of a stack of semiconductor layers with an alternation of layers containing a first semiconductor material such as Si and layers containing a second semiconductor material such as SiGe.

In order to create source and drain regions from such a structure, one possibility is to carry out epitaxial growth of a doped semiconductor material in-situ on lateral sides of the structure.

In order to allow the access resistances of the channel to be reduced, doping of semiconductor regions called "extension" regions located between the source and drain regions and the channel structure is preferably sought.

For this, after epitaxy, a diffusion of the dopants of the source and drain regions is possible. However, this diffusion may be difficult to control. Thus, at the same time as a reduction of the access resistances is desired, prevention of the doping of the channel structure is sought.

Thus, the problem of finding a new method improved with regard to the disadvantages mentioned above is encountered.

DISCLOSURE OF THE INVENTION

One goal of the present invention is to be able to dope extension regions in a semiconductor structure formed by semiconductor bars positioned above one another and suitable for forming a transistor channel, while seeking to prevent doping of the regions of the channel.

The goal stated above is reached via a method for creating a semiconductor structure provided with semiconductor bars positioned above one another, this method comprising the following steps:

creating, on a substrate, a stacked structure comprising an alternation of one or more first bars containing a first material and one or more second bars containing a second material, the second material being a semiconductor, the second bars comprising lateral portions protruding with respect to the lateral portion(s) of the first bar(s), then, surface doping the lateral portions, then forming insulating inner spacers against the first bar(s), forming source and drain blocks via growth of semiconductor material at regions of ends of said protruding lateral portions.

The doping carried out before the formation of the source and drain block allows doped extension regions to be obtained without necessarily having to later precisely control a diffusion of dopants from the source and drain blocks.

In such a structure, extension regions self-aligned with the insulating inner spacers are advantageously obtained.

The internal spacers are fabricated without deteriorating parts of the structure that are intended to form a channel region.

The surface doping of the protruding lateral portions can be carried out in such a way as to dope a lower face, a lateral face and an upper face of the protruding portions. Conformal doping is thus advantageously carried out, in such a way as to follow the geometry of the lateral portions of the second bars. This allows more uniform doping of the extension regions to be obtained and more uniform access resistances to be obtained.

In order to carry out the surface doping of the lateral portions, without doping the core of the structure, a low-energy doping method is preferably carried out. Thus, the majority of the dopants are located in a surface thickness typically of less than 3 nm. Low energy means an energy typically lower than 2 keV this energy being dependent on the species being used. For example, for doping using $BF_2$, an energy lower than 1 keV is provided.

According to one implementation possibility, the surface doping of the protruding lateral portions involves the deposition of a thin layer on the protruding lateral portions, this thin layer containing a doped material or a doping species on the protruding lateral portions. This type of doping allows a conformal doped area to be obtained without damaging the crystalline structure of the protruding lateral portions.

According to another implementation possibility, the surface doping of the protruding lateral portions can be carried out via a plasma. This type of doping also allows a conformal doped area to be obtained without damaging the crystalline structure of the protruding lateral portions.

After formation of the insulating inner spaces and before the formation of the source and drain blocks, thermal annealing for diffusion and activation of dopants is advantageously carried out.

The formation of insulating inner spacers against the first bar(s) allows a barrier for encapsulating the dopants to be created in order to prevent dose loss in areas of interest. The diffusion of the dopants allows more homogeneous doping of the extension regions to be obtained.

The formation of the insulating inner spacers can comprise the following steps:
deposition of a layer of dielectric material on the stack then, etching of the layer of dielectric material.

The etching of the layer of dielectric material can be carried out in such a way as to further remove a thickness of material at the ends of the protruding lateral portions and expose regions of ends of the second semiconductor bars.

Once this removal has been carried out, the regions located at the ends of the nanowires thus have a good crystalline quality, which allows the growth, via epitaxy, of the source-drain blocks to be promoted and/or the crystalline quality of the material of the source and drain blocks to be improved.

Alternatively, after etching of the layer of dielectric material, an etching or a cleaning, or an etching then a cleaning, are carried out in such a way as to remove a thickness of material at the ends of the protruding lateral portions and expose regions of ends of the second semiconductor bars.

The removal, via etching or cleaning, of material at the ends of the bars also allows a quality interface to be obtained before a step of epitaxy in order to form source and drain blocks.

The formation of said stacked structure can comprise the following steps:

formation of a stack comprising an alternation of layers containing the first material and layers containing the second material, formation of a mask on said stack, anisotropic etching of the stack.

The mask can be formed by a dummy gate block, also called sacrificial gate, and insulating spacers arranged on either side of this block, the insulating spacers containing another material that is dielectric and different from said given material, the method further comprising, after growth of the semiconductor material at regions of ends of said lateral portions, the following steps:

formation of an insulating layer for encapsulating the source and drain blocks, in such a way that an upper face of the dummy gate block is exposed, removal of the dummy gate block via selective etching of said given material and then of the first bars via selective etching of said first material, in such a way as to form a cavity, formation of a replacement gate in the cavity.

BRIEF DESCRIPTION OF THE DRAWINGS

The present invention will be better understood upon reading the description of examples of embodiments given, purely for informational purposes and in a way that is not at all limiting, in reference to the appended drawings in which:

FIGS. 1A to 1K, illustrate an example of a method for creating a channel structure of a transistor having semiconductor nanowires or bars positioned above one another and a surrounding gate;

FIGS. 2A-2B illustrate steps of doping and diffusion of dopants carried out in order to carry out controlled, conformal doping of regions of access to the channel structure also called extension regions;

FIGS. 3A to 3B illustrate etching or cleaning of ends of semiconductor portions on which growth of source and drain blocks is intended to be carried out.

Figure 1A:
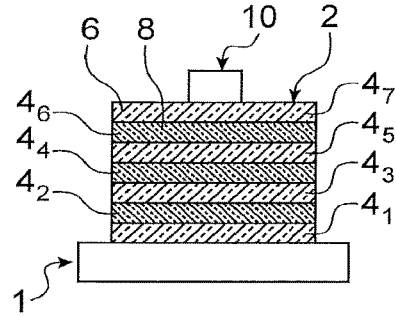

The various portions shown in the drawings are not necessarily on the same scale in order to make the drawings more legible.

DETAILED DISCLOSURE OF SPECIFIC EMBODIMENTS

An example of a method for manufacturing a microelectronic device having transistors and provided with at least one semiconductor structure having superimposed semiconductor bars will now be described in relation to FIGS. 1A-1K and 2A-2B.

The starting material of the method can be a substrate 1 of the type commonly called "bulk" substrate formed by a semiconductor layer or a semiconductor on insulator substrate comprising a semiconductor supporting layer coated with an insulating layer for example containing $SiO_2$, itself coated with a thin surface semiconductor layer.

A stack of layers is first created on this substrate 1. This stack 2 can be formed by an alternation of layers labelled $4_1$, $4_3$, $4_5$, $4_7$ containing a first material 6, which can be a semiconductor, and layers $4_2$, $4_4$, $4_6$ containing a second material 8 that is a semiconductor and different from the first material 6. The first material 6 is suitable for being etched selectively with respect to the second material 8. Typically, the stack 2 is formed by successive epitaxies of semiconductor layers. For example, the first material 6 contains silicon germanium while the second material 8 is made of silicon.

According to one implementation possibility, the layers $4_1$, $4_3$, $4_5$, $4_7$ containing the first material 6 may have a thickness for example between 4 and 12 nanometres, typically of approximately 8 nm. The layers $4_1$, $4_3$, $4_5$, $4_7$ containing the first material 6 are in this example thicker than the layers $4_2$, $4_4$, $4_6$ containing the second material 8. The layers $4_2$, $4_4$, $4_6$ may have a thickness, for example between 4 nm and 10 nm, typically of approximately 7 nm nanometres. Preferably, the layers $4_1$, $4_3$, $4_5$, $4_7$ (or $4_2$, $4_4$, $4_6$) made from the same material 6 (or 8) are provided with equal or substantially equal thicknesses.

Then, a dummy gate block 10 is formed on the stack 2 (FIG. 1A), that is to say, a sacrificial block reproducing that of a transistor gate. The dummy gate block 10 is formed by deposition of a layer containing a given material, for example such as polysilicon.

Then, a layer of photosensitive resin can be formed, for example containing polyimide on the layer of given material, and in the layer of resin, a mask of resin is defined via photolithography. Then, anisotropic etching of the layer of given material protected by the mask of resin is carried out, in order to create the dummy gate block under the mask of resin. After formation of the dummy gate block 10, the mask of resin is removed.

Then, spacers 12 are formed on either side of the dummy gate block 10. These spacers 12 are positioned against the lateral sides of the dummy gate block 10 and typically contain a dielectric material. The given material of the dummy gate block 10 is preferably chosen to be different from that of the spacers 12 and suitable for being selectively etched with respect to that of the spacers 12. The spacers 12 can for example contain SiCBN.

Then, a step of etching of the stack 2 of layers is carried out, in order to reproduce, in the stack 2, the pattern of the dummy gate block 10 and of the spacers 12, the assembly of the block 10 and the spacers 12 forming a mask. The etching is preferably anisotropic, and carried out for example via a $CF_4$ plasma.

Portions of the stack 2 that are not located under the mask 10-12 are thus eliminated.

Figure 1B:
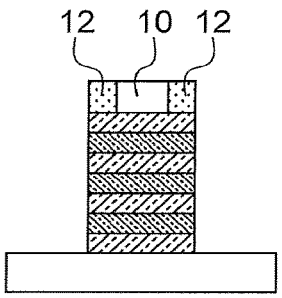

FIG. 1B illustrates a stacked structure obtained after this etching. This structure is formed by an alternation of etched layers typically in the form of bars $14_1$, $14_3$, $14_5$, $14_7$, containing the first material 6 and bars $14_2$, $14_4$, $14_6$, containing the second material 8. The stacked bars $14_1$, $14_3$, $14_5$, $14_7$, $14_2$, $14_4$, $14_6$ that are indifferently called "nanowires" have, for example, a parallelepipedic or substantially parallelepipedic shape.

Then, partial etching of portions of the stacked structure is carried out that can be isotropic, and selective, in such a way as to partially remove some of the bars $14_1$, $14_3$, $14_5$, $14_7$, of the stack. In this example, the bars containing the first material 6 are partially removed. The etching is preferably selective isotropic etching of a first semiconductor material with respect to a second semiconductor material. For example, in the case in which the bars $14_1$, $14_3$, $14_5$, $14_7$ contain SiGe while the layers $14_2$, $14_4$, $14_6$ contain for example silicon, the etching can be isotropic etching of the SiGe, selective with respect to the Si. Such etching can be carried out for example via HCl in the form of a gas, or via hot diluted SC1 cleaning ($NH_4O_4+H_2O_2$).

Figure 1C:
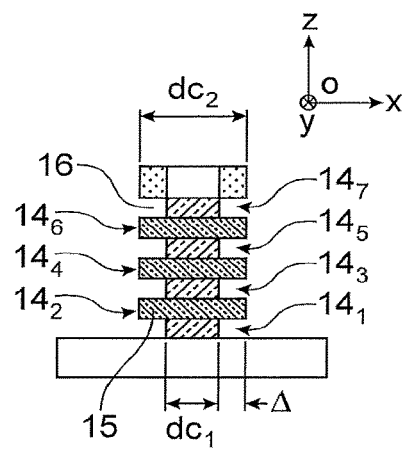

Thus, the lateral dimensions of the bars $14_1$, $14_3$, $14_5$, $14_7$ containing the first material 6 are reduced. FIG. 1C shows that their critical dimension is in particular reduced. Throughout the description, "critical dimension" means the smallest dimension of an element besides its thickness, the critical dimension being a dimension measured in a direction parallel to the main plane of the substrate (the main plane of the substrate being a supporting plane defined in the drawings as a plane parallel to the plane [O; x; y] of an orthogonal reference frame [O; x; y; z]).

Thus, a stacked structure is obtained comprising an alternation of bars $14_1$, $14_3$, $14_5$, $14_7$ containing the first material 6 and bars $14_2$, $14_4$, $14_6$ containing a second material 8 having lateral dimensions smaller than those of the bars $14_1$, $14_3$, $14_5$, $14_7$. In the view of FIG. 1C, this manifests itself as an alternation of bars $14_1$, $14_3$, $14_5$, $14_7$ containing the first material 6 and having a first critical dimension $dc_1$ and bars $14_2$, $14_4$, $14_6$ containing a second material 8 and having a second critical dimension $dc_2$ greater than the first critical dimension $dc_1$.

The bars $14_2$, $14_4$, $14_6$ containing the second material 8 thus comprise lateral portions 15 that protrude, at the lateral regions of the stacked structure, with respect to the bars $14_1$, $14_3$, $14_5$, $14_7$ containing the first material 6. A protrusion Δ of the protruding portion of the bars $14_2$, $14_4$, $14_6$ containing the second semiconductor material 8 for example between 2 nm and 10 nm, in particular of 6 nm can be for example provided.

Because of the difference in lateral dimensions between the bars $14_1$, $14_3$, $14_5$, $14_7$ and the bars $14_2$, $14_4$, $14_6$, the structure comprises a serrated profile, with notches 16 or grooves 16 at its lateral sides.

Then, doping of the lateral faces of the stacked structure comprising an indentation is carried out, and in particular at the bars $14_2$, $14_4$, $14_6$ containing the second material 8 that protrude. Doping of lateral faces or lateral sides of the portions that stick out or protrude can be in particular provided in order to obtain a doped area 17 under the mask 10-12, the arrangement of which follows the serrated profile. When the bars $14_2$, $14_4$, $14_6$ are made of silicon, the silicon protruding from the structure is thus doped.

In particular, preference is given to a doping method that allows conformal doping and allows doping of both a lower face $15i$ and an upper face $15s$ and a lateral face $15l$ of the lateral portions 15 of the bars $14_2$, $14_4$, $14_6$ that protrude.

The type of doping, N or P, is chosen according to the type of transistor that is desired.

According to one implementation possibility, the addition of dopants can be carried out via deposition of a thin layer rich in dopants for example containing Boron or Phosphorus or Arsenic. This thin layer can be, for example, a layer of a doping species such as an MLD layer (for "mono layer doping"), an implementation of which is for example described in the document "Wafer scale, sub-5 nm Junction Formation by Monolayer Doping and Conventional Spike Annealing", by Ho et al., Nanoletters 2009 Vol. 9, No. 2 725-730. The doping species is then diffused in the semiconductor material.

Advantageously, a conformal deposition technique is used to produce the thin layer rich in dopants, in particular by a method of the ALD type (for "Atomic Layer Deposition") or PEALD (for "Plasma Enhanced Atomic Layer Deposition", i.e. ALD assisted by plasma). CVD ("Chemical Vapour Deposition" i.e.), PE-CVD ("Plasma Enhanced Chemical Vapor Deposition") or SA-CVD ("subatmospheric Chemical Vapor Deposition") techniques may also be implemented. An IADD (Ion Assisted Deposition and Doping) method may also be used to make the thin layer rich in dopants.

The thin layer used to carry out the doping can also be a layer made from a material rich in dopants, for example a semiconductor material such as Si or a dielectric material such as SiN, preferably highly doped. The thin layer can in particular be a layer made via an ALD (for "Atomic Layer Deposition") or PEALD (for "Plasma Enhanced Atomic Layer Deposition", i.e. ALD assisted by plasma) method. For doping with Boron, the thin layer can be enriched using $BF_3$ or $B_2F_4$. The thin layer may have a thickness of approximately one or several nanometres, for example 1 nm. A thin layer very rich in doping species for example greater than 90% is preferably provided.

An ALD doping method as described for example in the document "ALD Process for Dopant-Rich Films on Si", Seidel et al., 2016 $21^{st}$ International Conference on Ion Implantation Technology (IIT) can be in particular implemented.

Alternatively, a doping method as described for example in the document U.S. Pat. No. 8,796,124B2 or in the document U.S. Pat. No. 9,450,097B2 can be used.

An advantage of such a doping technique is that a high concentration of dopants at the surface of the protruding portions of the bars $14_2$, $14_4$, $14_6$ can be obtained.

Doping according to a technique as described above also allows the serrated structure to be doped without damaging the doped surfaces and without penetrating areas intended to form a channel structure. The doping of portions located facing the dummy gate structure 12 is thus prevented.

Figure 1D:
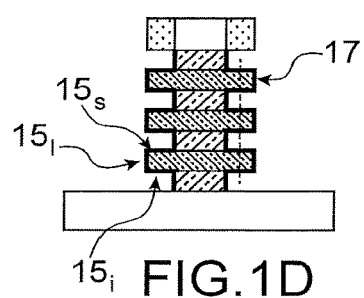
Figure 1E:
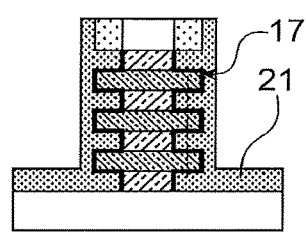

Such a doping technique also provides uniform doping between a lower face $15i$ of the lateral portions 15 of bars $14_2$, $14_4$, $14_6$, protruding, a lateral face $15l$ and an upper face $15s$ of these same lateral portions 15, wherein the thin layer containing a doping species or a doped material can be distributed over each of these faces $15i$, $15l$, $15s$ (FIG. 1D).

Another alternative involves doping via a low-energy ion beam, that is to say, typically of less than 2 keV.

FIG. 2A gives a perspective view of a lateral portion 15 of a bar $14_2$ and shows a distribution of the doped area 17 obtained forming an envelope around a central region or core 18 of the non-doped bar $14_2$.

Alternatively to the doping obtained via formation of a thin layer of doped material or doping species, doping can be carried out via a plasma, according to a technique for example as described in the document "plasma Doping of Silicon Fin Structures", by Fetch et al., 11th International Workshop on Junction Technology (IWJT), 2011. This type of doping can also allow the formation of a doped area having a conformal thickness on the protruding lateral portions 15 of the bars $14_2$, $14_4$, $14_6$, and allow doping of a thickness at the surface of the bars $14_2$, $14_4$, $14_6$, without doping the core of these bars $14_2$, $14_4$, $14_6$ and without damaging their outer surface.

Then, conformal deposition of dielectric material 21 is carried out (FIG. 1E) in order to cover the stacked structure and fill in the notches 16 or grooves 16 formed between the lateral portions 15 of semiconductor bars $14_2$, $14_4$, $14_6$ that protrude. The dielectric material 21 can for example contain silicon nitride (SiN).

Figure 1F:
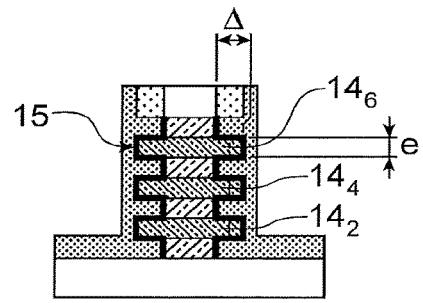

At least one thermal annealing adapted in such a way as to diffuse the dopants and increase the thickness of the doped area 17 in the protruding portions 15 of the semiconductor bars $14_2$, $14_4$, $14_6$ can then be carried out (FIG. 1F). Diffusion over the entire thickness of the bars can be implemented, partly when the protruding portion of the bars has a dimension Δ equivalent or close to the thickness e of the bars. For example, controlled diffusion over a distance of approximately 3 nm can be carried out in order to obtain doping over the entire thickness of a bar having a thickness of approximately 6 nm.

In order to carry out the diffusion of dopants, annealing of the type commonly called "spike" having a short duration for example of approximately one to several seconds at a high temperature for example between 950° C.-1050° C. is for example carried out in order to allow migration and activation of dopants in the core of the semiconductor material of the semiconductor portions 15. Annealing with a temperature and duration chosen in such a way as to limit the migration to several nm can be sufficient in order to keep the dopants in the extension zone without them migrating to the channel.

Thus, uniform doping of the regions called "extension" regions of the bars $14_2$, $14_4$, $14_6$ that correspond to the protruding portions 15 located facing the lateral blocks 12 of the mask can be obtained without doping a region located facing the dummy gate block 10.

The fact that this step is carried out at this moment in the method rather than after the step described above with regard to FIG. 1D allows the desorption of dopants to be prevented and a maximum dose to thus be preserved.

Figure 1G:
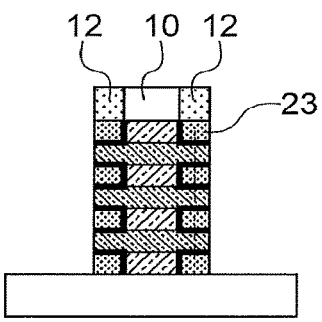

Etching of the dielectric material 21 is then carried out, preferably in such a way as to only preserve this dielectric material 21 in a region located under and facing the mask 10-12 (FIG. 1G). Inner spacers 23 are thus formed around and between the lateral portions 15 of the semiconductor bars $14_2$, $14_4$, $14_6$.

Etching via a wet etching method (isotropic) or a dry etching technique (anisotropic) can be used. The document "Vertically stacked-NanoWires MOSFETs in a replacement metal gate process with inner spacer and SiGe source/drain", by Barraud et al., Electron Devices Meeting (IEDM), 2016 IEEE International gives an example of a method for creating inner spacers.

For example, when the semiconductor bars $14_2$, $14_4$, $14_6$ are made of silicon and the inner spacers 23 are made of silicon nitride (SiN), etching via $H_3PO_4$ is typically carried out in order to selectively remove excess portions of SiN.

Cleaning of the bars $14_2$, $14_4$, $14_6$ can optionally then be carried out in order to remove an exposed thickness of the semiconductor bars $14_2$, $14_4$, $14_6$. Such cleaning can allow a deoxidation of a possible thickness of $SiO_2$ formed on the surface of the protruding portions 15 of the semiconductor bars $14_2$, $14_4$, $14_6$ to be carried out.

When the semiconductor bars $14_2$, $14_4$, $14_6$ are made of silicon, cleaning using HF can be used in order to allow slightly oxidised ends of the portions 15 to be removed and end regions of the semiconductors $14_2$, $14_4$, $14_6$ to be exposed.

The removal by cleaning and J or etching is preferably carried out so as to remove a doped material thickness at the end regions of the bars $14_2$, $14_4$, $14_6$ and uncover end regions based on semiconductor material which may be undoped or have been slightly modified by the doping previously described, and therefore of better crystalline quality.

This allows regions having a better crystalline quality to be exposed and later growth of semiconductor material on the protruding portions 15 of the semiconductor bars $14_2$, $14_4$, $14_6$ to be promoted.

Figure 1H:
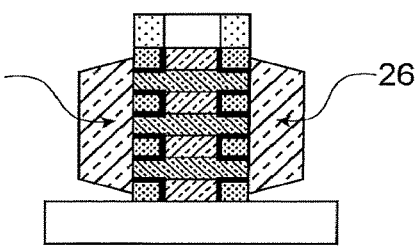

Such growth of semiconductor material on the semiconductor bars $14_2$, $14_4$, $14_6$ containing the second material 8 can then be carried out, in such a way as to form source and drain blocks 26, 28 (FIG. 1H).

In-situ doping can be carried out during the formation of the source and drain blocks 26, 28.

An insulating encapsulation 29 of the stacked structure is then formed.

This encapsulation can be carried out via deposition of an encapsulation layer containing a dielectric material, for example containing silicon oxide in such a way as to cover the structure and then carry out removal of a thickness of this encapsulation layer 29 in such a way as to expose an upper face of the mask 10-12 corresponding to the top of the stacked structure (FIG. 1I). This removal can be carried out via a CMP planarization method.

The dummy gate block 10 is then removed while preserving the spacers 12 positioned on either side of this block 10. This can be carried out via selective etching of the given material (FIG. 1J).

When the central dummy gate block 10 contains polysilicon, the selective removal can be carried out for example via TMAH. The removal of the dummy gate block 10 leads to the formation of an opening 30 exposing the stack of bars $14_1$, $14_3$, $14_5$, $14_7$, $14_2$, $14_4$, $14_6$. Selective removal of the first material 6 is then carried out in such a way as to remove the bars $14_1$, $14_3$, $14_5$, $14_7$ containing this material 6 and thus free a central portion of the semiconductor bars $14_2$, $14_4$, $14_6$ (FIG. 1J). A cavity 32 defining a gate position is thus formed.

A gate dielectric 35 for example such as $SiO_2$ is then deposited around the bars $14_2$, $14_4$, $14_6$, and then a gate material 36 for example such as polysilicon is deposited in order to form a gate in the cavity 32. This gate is surrounding in such a way that it is arranged around a central portion of the semiconductor bars $14_2$, $14_4$, $14_6$ (FIG. 1K).

As an alternative to the example of an embodiment described just above, a thickness of the ends of the portions 15 of the semiconductor bars $14_2$, $14_4$, $14_6$, can be removed during the etching of the layer of dielectric material 23 carried out in order to form inner spacers or after such etching.

In the example of an embodiment illustrated in FIGS. 3A-3B, regions having a better crystalline quality are exposed and later growth of semiconductor material on the protruding portions 15 of semiconductor bars $14_2$, $14_4$, $14_6$ is promoted.

For example, cleaning that removes doped Si selectively with respect to the non-doped Si easily allows a crystalline end without defects to be obtained.

Such removal can be carried out for example via etching using HCl when the semiconductor bars $14_2$, $14_4$, $14_6$ are made of silicon in order to obtain regions of slightly eroded ends made of crystalline Si on which the source and drain blocks will be grown. Such removal can also be coupled with a method for cleaning with HF as described above.

The invention claimed is:

1. A method for fabricating a microelectronic device with at least a transistor comprising a semiconductor structure provided with semiconductor bars positioned above one another, the method comprising the following steps:
   forming, on a substrate, a stacked structure comprising an alternation of one or more first bars of a first material and one or more second bars of a second material, the second material being a semiconductor, the second bars comprising lateral portions protruding with respect to lateral portions of the first bars; then,
   surface doping the lateral portions of the stacked structure; then, forming insulating inner spacers against the first bars, the forming comprising depositing a dielectric material layer on the stacked structure and then etching the dielectric material layer;

removing, during or after the etching of the dielectric material layer, a material thickness at a side face of the protruding lateral portions so as to reveal end regions of the second bars; and then, forming source and drain blocks via growth of semiconductor material at regions of ends of the lateral portions of the first and the second bars.

2. The method according to claim 1, wherein the lateral portions of the first and the second bars form a serrated profile, the surface doping of the stacked structure being conformal and carried out so as to conduct doping of a lower face, a lateral face, and an upper face of the protruding lateral portions of the second bars, and thereby form a doped zone with an arrangement having the serrated profile.

3. The method according to claim 2, wherein the surface doping involves conformal deposition of a thin layer containing a doped material or a thin layer of doping species on the protruding lateral portions of the second bars.

4. The method according to claim 1, wherein the surface doping is a conformal doping carried out via a plasma.

5. The method according to claim 1, wherein, after the forming of the insulating inner spaces and before the forming of the source and the drain blocks, performing a thermal annealing for diffusion of dopants.

6. The method according to claim 1, wherein the forming of the stacked structure comprises the following steps:

forming a stack comprising an alternation of layers containing the first material and layers containing the second material, and of a mask on the stack; and anisotropic etching of the stack.

7. The method according to claim 6, wherein the mask is formed by a central block containing a given material and reproducing a transistor-gate pattern and lateral blocks arranged on either side of the central block, the lateral blocks containing another material, dielectric and different from the given material, the method further comprising, after the growth of the semiconductor material at the regions of the ends of the lateral portions so as to form the source block and the drain block:

forming an insulating layer for encapsulating the source and the drain blocks, such that an upper face of the central block is exposed;

removing the central block via selective etching of the given material and then of the first bars via selective etching of the first material, so as to form a cavity; and forming a gate in the cavity.

8. The method according to claim 1, wherein the removing of the material thickness at the side face of the protruding lateral portions so as to reveal the end regions of the second bars comprises a dry etch, conducted with an $O_2$ plasma.

* * * * *